United States Patent [19]
Liebmann et al.

[11] Patent Number: 5,807,649
[45] Date of Patent: Sep. 15, 1998

[54] LITHOGRAPHIC PATTERNING METHOD AND MASK SET THEREFOR WITH LIGHT FIELD TRIM MASK

[75] Inventors: Lars W. Liebmann, Dutchess County, N.Y.; David S. O'Grady, Chittenden County, Vt.; Richard A. Ferguson, Dutchess County, N.Y.; William J. Adair, Chittenden County, Vt.

[73] Assignees: International Business Machines Corporation, Armonk, N.Y.; Lockheed Martin Corporation, Bethesda, Md.

[21] Appl. No.: 740,598

[22] Filed: Oct. 31, 1996

[51] Int. Cl.$^6$ .................................................. G03F 9/00
[52] U.S. Cl. .................................. 430/5; 430/22; 430/322
[58] Field of Search ................................. 430/5, 22, 322, 430/311

[56] References Cited

U.S. PATENT DOCUMENTS

| | | | |
|---|---|---|---|
| 5,018,074 | 5/1991 | Griffith et al. | 364/490 |
| 5,326,659 | 7/1994 | Liu et al. | 430/5 |
| 5,340,700 | 8/1994 | Chen et al. | 430/312 |
| 5,403,682 | 4/1995 | Lin | 430/5 |
| 5,411,823 | 5/1995 | Okamoto | 430/5 |
| 5,424,154 | 6/1995 | Borodovsky | 430/5 |
| 5,436,095 | 7/1995 | Mizuno et al. | 430/5 |
| 5,468,578 | 11/1995 | Rolfson | 430/5 |
| 5,532,090 | 7/1996 | Borodovsky | 430/5 |
| 5,537,648 | 7/1996 | Liebmann et al. | 395/500 |
| 5,620,816 | 4/1997 | Dao | 430/5 |

OTHER PUBLICATIONS

Waas, et al., Microelectronic Engineering, 23 (Nov. 1994), pp. 139–142.

Levenson, Marc, Jpn. J. Appl. Phys., vol. 33 (Dec. 1994), Part 1, No. 12B, Dec. 1994, pp. 6765–6773.

Galan, G., et al., Jpn. J. Appl. Phys., vol. 33 (Dec., 1994), Part 1, No. 12B, Dec. 1994, pp.

Primary Examiner—S. Rosasco
Attorney, Agent, or Firm—Whitham, Curtis & Whitham

[57] ABSTRACT

A lithographic patterning method and mask set using a phase shift trim mask having mask dimensions increased in block size so as to remove previous exposure defects.

20 Claims, 6 Drawing Sheets

LITHOGRAPHIC PATTERNING METHOD AND MASK SET THEREFOR WITH LIGHT FIELD TRIM MASK

BACKGROUND OF THE INVENTION

1. Field of the Invention

The present invention generally relates to the manufacture of very large scale integrated (VLSI) circuits and, more particularly, to a method and apparatus for resolution enhancement of photolithographic images through the use of phase shifted masks.

2. Description of the Related Art

A very large scale integrated (VLSI) complementary metal oxide semiconductor (CMOS) chip is manufactured on a silicon wafer by a sequence of material additions (i.e., low pressure chemical vapor depositions, sputtering operations, etc.), material removals (i.e., wet etches, reactive ion etches, etc.), and material modifications (i.e., oxidations, ion implants, and so forth). These physical and chemical operations interact with the entire wafer. For example, if a wafer is placed into an acid bath, the entire surface of the wafer will be etched away. In order to build very small electrically active devices on the wafer, the impact of these operations has to be confined to small, well defined regions.

Lithography in the context of VLSI manufacturing of CMOS devices is the process of patterning openings in photosensitive polymers (sometimes referred to as photoresists or resists) which define small areas in which the silicon base material is modified by a specific operation in a sequence of processing steps. The manufacturing of CMOS chips involves the repeated patterning of photoresist, followed by an etch, implant, deposition, or other operation, and ending in the removal of the expended photoresist to make way for a new resist to be applied for another iteration of this process sequence.

The basic lithography system consists of a light source, a stencil or photomask containing the pattern to be transferred to the wafer, a collection of lenses, and a means for aligning existing patterns on the wafer with patterns on the mask. Since a wafer containing from fifty to one hundred chips is patterned in steps of one to four chips at a time, these lithography tools are commonly referred to as steppers. The resolution of an optical projection system such as a lithography stepper is limited by parameters described in Rayleigh's equation:

$$R = k_1 \lambda / NA, \quad (1)$$

where $\lambda$ is the wavelength (in $\mu m$) of the light source used in the projection system and NA is the numerical aperture of the projection optics used. $k_1$ is a factor describing how well a combined lithography system can utilize the theoretical resolution limit in practice and can range from 0.8 down to 0.5 for standard exposure systems. R represents the resolution in $\mu m$. The highest resolution in optical lithography is currently achieved with deep ultra violet (DUV) steppers operating at 248 nm wavelengths but mid ultra violet (MUV) steppers with a wavelength of 356 nm are also in widespread use.

Conventional photomasks consist of chromium patterns on a quartz plate, allowing light to pass wherever the chromium is removed from the mask. Light of a specific wavelength is projected through the mask onto the photoresist coated wafer, exposing the resist wherever hole patterns are placed on the mask. Exposing the resist to light of the appropriate wavelength causes modifications in the molecular structure of the resist polymers which allows developer to dissolve and remove the resist in the exposed areas. (Negative resist systems allow only unexposed resist to be developed away.) The photomask, when illuminated, can be pictured as an array of individual, infinitely small light sources which can be either turned on (points in clear areas) or turned off (points covered by chrome). If the amplitude of the electric field vector which describes the light radiated by these individual light sources is mapped across a cross section of the mask, a step function will be plotted reflecting the two possible states that each point on the mask can be found in (light on, light off).

These conventional photomasks are commonly referred to as chrome on glass (COG) binary masks, due to the binary nature of the image amplitude. The perfectly square step function exists only in the theoretical limit of the exact mask plane. At any distance away from the mask, such as in the wafer plane, diffraction effects will cause images to exhibit a finite image slope. At small dimensions, that is, when the size and spacing of the images to be printed are small relative to the $\lambda / NA$ (NA being the numerical aperture of the exposure system), electric field vectors of adjacent images will interact and add constructively. The resulting light intensity curve between the features is not completely dark, but exhibits significant amounts of light intensity created by the interaction of adjacent features. The resolution of an exposure system is limited by the contrast of the projected image, that is the intensity difference between adjacent light and dark features. An increase in the light intensity in nominally dark regions will eventually cause adjacent features to print as one combined structure rather than discrete images.

The quality with which small images can be replicated in lithography depends largely on the available process latitude; that is, the amount of allowable dose and focus variation that still results in correct image size.

Blocking masks have been used for non-phase shifting lithography. The standard dark field trim mask or phase gradients do not require trim masks but increase the mask cost and complexity.

Masks have been fabricated for phase shift applications. Phase shifted mask (PSM) lithography improves the lithographic process latitude or allows operation of a lower $k_1$ value (see equation 1) by introducing a third parameter on the mask. The electric field vector, like any vector quantity, has a magnitude and direction, so in addition to turning the electric field amplitude on and off, it can be turned on with a 0° phase or turned on with a 180° phase. This phase variation is achieved in PSMs by modifying the length that a light beam travels through the mask material. By recessing the mask by the appropriate depth, light traversing the thinner portion of the mask and light traversing the thicker portion of the mask will be 180° out of phase; that is, their electric field vectors will be of equal magnitude but point in exactly opposite directions so that any interaction between these light beams results in perfect cancellation. For more information on PSM, the reader is referred to "Phase-Shifting Mask Strategies: Isolated Dark Lines", Marc D. Levenson, *Microlithography World,* March/April 1992, pp. 6–12.

However, the limits of PSM lithography are now being challenged by the manufacture of high-performance logic derivatives of advanced Dynamic Random Access Memory (DRAM) technologies. These technologies are entering development cycles with immediate requirements for sub-quarter micron printed gate lengths and tight dimensional control on the gate structures across large chip areas. Since these logic technologies are based on shrinking the gate length in an established DRAM technology, the overall layout pitch remains constant for all critical mask levels, resulting in narrow, optically isolated lines on the scaled gate level. The requirement for tight line width control on narrow isolated lines has driven the requirement for phase edge PSMs for these logic applications.

A phase edge phase shifted mask is a type of phase shifted mask technique. More particularly, phase edge PSM lithography makes use of contrast enhancement caused by a phase transition under an opaque feature on a mask. This phase transition is achieved by etching an appropriate depth into the quartz mask substrate on one side of a narrow line structure on the mask. Not all narrow line structures on the mask close upon themselves, some edges of the etched region will terminate in bare quartz regions. Since the 180° phase transition forces a minimum in the image intensity, narrow dark lines will be printed by these excess phase edges. The unwanted images are erased using a trim mask, which is a second mask that transmits light only in regions left unexposed by the residual phase edge.

Two major problems are confronted in the implementation of phase edge phase shifted masks. As one problem, the phase shifted mask is very difficult to manufacture, especially without defects. On standard (binary chrome on glass) mask defects are commonly located at the end of the mask manufacturing process and then eliminated in a repair process to yield a perfect mask. By comparison, the mask inspection and repair requirements for a phase edge PSM are significantly more complex than for such standard masks. As a second problem associated with phase edge PSMs, the exposure of phase edge PSMs has to be done in two steps: first the wafers are exposed to the actual PSM and then residual edges that are unavoidable in the design and manufacture of this type of PSM have to be obliterated by a second exposure. This double exposure process is very inconvenient and costly, and it reduces the lithographic process latitude of the combined photo process to a certain degree. It is understood that this comparison is made to the theoretical scenario of using only the PSM without a trim mask, which would give a very large process latitude but would yield unusable patterns. Despite these problems with phase edge PSMs, the inconvenience of trim masks and the reduction in process latitude have nonetheless been generally tolerated in the lithography of logic device processing technologies because of the significant gains in feature resolution that can be derived by use of phase edge PSMs.

FIG. 3 shows a conventional trim mask design used with a phase edge PSM for a sample gate level circuit pattern 1 selected and illustrated in FIG. 1. FIG. 2 shows the phase shifted design applicable to the sample circuit pattern 1. In FIG. 2, an illustrative opaque masking pattern feature 10 is shown as a "comb-like" configuration having "tines" 11–17. The comb structure 10 used as an example can be found in the gate level of chip designs whenever it is necessary to turn on a series of gates (i.e., the tines) at the same time by applying a voltage to the base of the comb. The tines are critical features requiring a phase transition.

Considering tine 11, a transition from white (unshifted, 0°) background 20 to the transparent phase region 11a (indicated in diagonals) which is formed as a 180° phase shift area, is shown. Similar phase transitions are shown for tines 12–17. The residual phase edges 11e, 13e, 14e, 15e, 16e, and 17e are edges of the phase regions 11a, 13a, 14a, 15a, 16a, and 17a, respectively, that do not overlap the associated opaque patterns 11–17.

A comparative light field trim mask design 130 is shown in FIG. 3 that is premised on the concept of exposing just enough area around each residual phase edge image to completely remove the image on the wafer without adversely impacting the lithographic performance of any adjacent desired image. Towards this end, a conventional type of trim mask 130 is designed as a dark field mask with the trim pattern designed as light transmitting areas or openings 130a, 130b, 130c, 130d, 130e and 130f defined within an opaque background, where the openings 130a–130f (areas indicated with horizontal lines) have sufficient width provided to create overlap distance w at each associated residual phase edge 11e–17e, as shown in FIG. 3. All PSM (phase edge phase shifted mask) patterns that are not in close proximity to a residual phase edge will not get exposed to light since the trim mask is dark field. Being that most patterns on the PSM, other than images resulting from the residual phase edges, are desired on the wafer, this arrangement would be expected to work well in principle.

By way of example, U.S. Pat. No. 5,424,154 (Borodovsky) describes use of a second mask following a prior exposure via a first mask using oblique illumination, pupil filtering, or phase shifting, where the second mask is used as a dark field trim mask. In U.S. Pat. No. 5,424,154, complimentary images and active region images are formed on a photosensitive layer with the first and second mask set, where, after the two mask exposures, the complimentary images are obliterated.

However, in actual practice, mask exposure defects on the PSM persist as a major concern in implementing the lithography technique. In particular, prior dark field trim masks for phase shifted masks used in photolithographic techniques suffer from the drawback of permitting exposure onto unwanted areas being fabricated. Moreover, inspection for such defects and their repair is onerous and ungoverned by any standarized practices in the industry, which can raise quality control concerns.

Mask manufacturing and exposure processes that might minimize the occurrence or impact of such defects would greatly reduce the cost of phase edge PSM lithography and would enable more timely exploitation of the PSM technique. However, prior to the present invention, defect-free phase edge type PSMs have proven elusive to attain in practice.

SUMMARY OF THE INVENTION

It is an object of the present invention to provide a method and apparatus for eliminating residual phase edge images and reducing the defect sensitive area on phase edge PSMs.

It is another object of the present invention to provide a trim mask design routine that selectively expands desired patterns on the PSM to create protect shapes for the trim mask.

These and other objects, advantages, and benefits are achieved with an inventive phase shift trim mask having mask dimensions increased in block size and width so as to remove previous exposure defects. More particularly, the inventive method incorporates use of a trim mask that protects the circuit pattern shapes printed (defined) in a prior (first) exposure with the phase edge PSM and exposes to permit obliteration of all other photosensitive areas, rather than obliterating only the unwanted residual phase edge patterns.

In a preferred embodiment of this invention, the inventive mask set is used to form an image in a photosensitive layer that is a positive photoresist. The masks have light blocking regions corresponding to the active features, and open light transmitting areas surrounding the active features. After the photoresist layer is developed, the masked layer is etched to form patterned lines and gates using conventional methods.

The benefits of the inventive technique are substantial. As one benefit, since all areas uncovered by the protect shapes will be erased, it does not matter if there are defects on the PSM in those areas. The defect critical area of the PSM is therefor confined to the protect shapes, which is a much smaller region than the entire chip area. For a given defect density (defects per area), the chances of building a perfect mask (i.e., no defects that would compromise the circuit) is improved in direct proportion to the critical area reduction. As another benefit, the design of blockout shapes, which are directly scaled from the original design, and which are essentially independent of the PSM design, is simplified in comparison to a conventional trim mask design which has to trace the phase edges that themselves were derived in an elaborate CAD routine.

As a consequence, the present invention provides phase shifted masks which enhance lithographic process latitude and thereby allow smaller patterns to be replicated in a VSLI process.

Additionally, the trim mask used in the present invention can be implemented as a light field trim mask. A light field mask means isolated dark masking regions are surrounded by a radiation transmitting background. The isolated mask regions in the trim mask preferably are dimensioned such that the overall two-dimensional shape of the isolated mask region has a shape sizing equal to and completely overlapping an active feature region defined by the PSM mask plus an added amount of enlargement from each phase edge represented by an extension from each side edge of the active feature region defined by the PSM pattern.

In implementing the present invention, the protect shape preferably should be expanded an amount relative to the dimensions of the original design shape that is at least the value of the overlay error between the PSM mask and the protect (trim) mask. In addition, the isolated mask regions in the trim mask should have a minimum feature size determined as a protect shape size that can be easily printed without the benefit of phase shifting. A minimum feature size of at least about 1.0 Rayleigh units will generally satisfy this latter condition. A Rayleigh unit is defined as $\lambda/NA$, where $\lambda$ is defined in $\mu m$.

These trim mask design features of the present invention have been discovered to significantly reduce the exposure defects encountered that are associated with use of conventional trim masks in phase edge masks. This invention thus provides a technique by which a trim mask can be used to effectively eliminate defect sensitive area on the mask when using a phase edge PSM. Namely, the light field trim mask used in this invention trims extraneous wafer resist patterns created by exposed phase edges. Further, the present invention obviates the need to repair defects on a phase edge Phase Shift Mask (PSM). The invention can be easily integrated into virtually any high end VLSI IC fabrication.

The present invention also embraces a mask set including the light field trim mask discussed herein as well as methods of patterning a photosensitive layer with the inventive mask set arrangement.

These and other objects and features of the invention will become more fully apparent from the several drawings and description of the preferred embodiments.

DETAILED DESCRIPTION OF A PREFERRED EMBODIMENT OF THE INVENTION

The present invention involves taking the original circuit designs (i.e., the designs defining the opaque chrome shapes on the mask) and expanding them to derive a protect shape employed in the trim mask. Two conflicting interests must be resolved in determining the size of the blockout shape (or more appropriately the expansion factor used to create the blockout shape). Specifically, the larger the blockout shape, the smaller the lithographic impact of the dual exposure, i.e., phase edge PSM and trim mask.

In the present invention, an objective, in one sense, is to hide the original high resolution patterns under a shadow of the protect shape, which is printed with a lower resolution process, and the wider the shadow cast by the trim mask, the better the original shape will be protected. On the other hand, the defect critical area on the PSM scales directly with the area of the protect shape, so as the protect shapes grow, the benefit decreases of doing a light field trim for defect sensitivity reduction.

Figure 7:
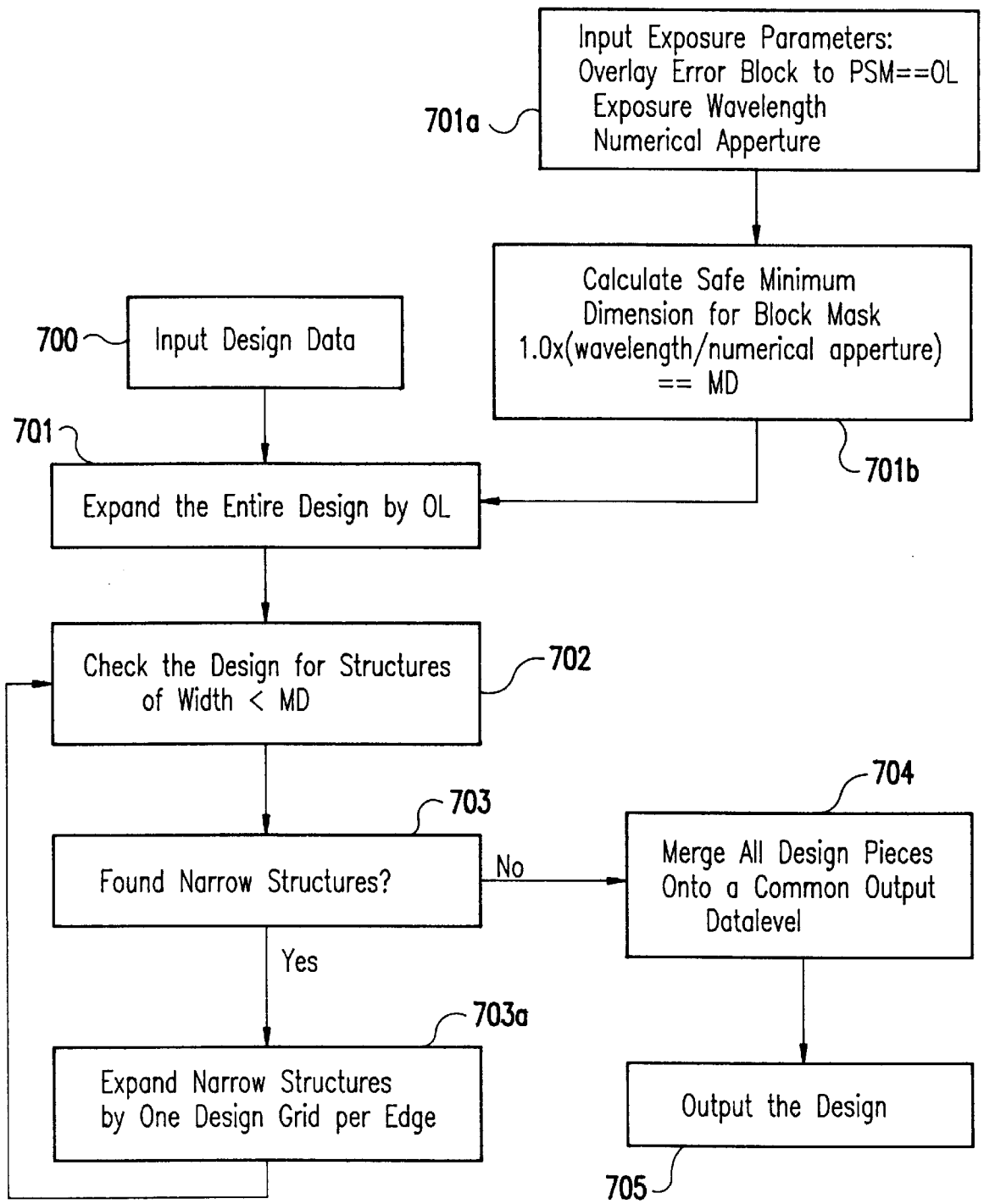
FIG. 7 is a flow chart showing the logic of a process implemented according to the invention.

With these basic considerations in mind, the appropriate protect trim mask to be used in conjunction with a phase shifted mask to lithographically pattern, according to the present invention, an integrated circuit design into a photosenstive layer is described by the logic set forth in the flow chart of FIG. 7.

Function block 701A of FIG. 7 describes inputting a first criterion to properly dimension the trim mask. In ascertaining how much the features have to be expanded, the present invention considers the fact that there is always a certain degree of error in the alignment of two mask levels (i.e., PSM and trim) in lithography and thus there will be an overlay error between the PSM and the protect (trim) mask. It is therefore necessary to increase the protect shapes in size to account for this overlay error, in the manner described herein. Namely, the amount of expansion of the protect shape relative to the corresponding original design feature shape defined by the PSM mask should be a value that is at least the amount of the overlay error between the PSM and the protect mask. The terminology "overlay error", i.e., abbreviated as "OL" in FIG. 7, is a characteristic dimensional variation associated with an alignment system of an exposure tool, and it is a measure of the worst case misregistration between two levels at variance from the ideal alignment. For instance, if Δ is the worst-case registration between two adjacent aligned levels (i.e., the PSM mask and protect trim mask here) and there are n alignment steps between PSM ("A") and trim ("B") levels, then the worst-case misregistration distance $M_{A,B}$ (in μm) is calculated by the standard equation as $M_{A,B}=(n^{1/2}\Delta)$ where Δ is assumed to be the same for all levels. In the present invention, there is only single alignment step encountered in use of the single PSM mask and a single trim mask. Therefore, n equals 1 for this invention and the above-equation reduces to $M_{A,B}=\Delta$, which means that the overlay error "OL" equals the worst case misregistration distance per se.

As described in function block 701B of FIG. 7, a second criterion for generation of the appropriate protect shape relates to the overall size (width) of the protect shape. In the present invention, the "minimum feature size", i.e., abbreviated as "MD" in FIG. 7, of the protect shape is a dimension that is easily printed without benefit of phase shifting. The minimum feature size for the protect shape is thus a function of the minimum dimension of the protect shape that can be routinely reproduced and resolved in a lithographic process. As shown in function block 701B, to meet this second criterion, a minimum feature size in micrometers (i.e., the minimum edge-to-edge distance measured in μm in any direction taken across the feature) of the protect shapes constituting the trim mask should calculated as one having a magnitude of at least about 1.0 Rayleigh units (λ/NA) or greater. For example, where λ is 248 nm (0.248 μm) and NA is 0.5, 1.0 Rayleigh units for this exposure system is a value of about 0.5 μm, and it follows the minimum protect shape size preferably should be established as being at least 500 nm (0.5 μm). If the protect shape is too small, the image can become blurred, e.g., light leaks into the nominally protected region to reduce process latitude. By applying this second inventive criterion to other exposure tools, the actual protect shape size will vary depending on the respective values of λ and NA, but the effect will be the same (i.e., the protect shape will be easily printed).

Next, as shown in function block 701, the input design data provided in function block 700 is expanded to establish the protect mask configuration by factoring in the "OL" value supplied from function block 701A. More specifically, in function block 701, the configuration of the protect trim mask is established by expanding the opaque device patterns set forth in the PSM mask by the "OL" value. Next, as indicated in function block 702, a check must be made to ensure that the widths of the protect shape are equal to or greater in value than "MD" (i.e., at least one Rayleigh unit). Therefore, the first inventive criterion "OL" described above is also subject to the second criterion "MD", i.e., the protect shape not only has to be larger than the original design by at least the amount of the overlay error "OL", but additionally, the amount of enlargement must provide a protect shape that is no smaller than 1.0 Rayleigh unit (i.e., ≧MD).

If this second criterion is satisfied (i.e., structure widths≧MD), then all design pieces can be merged onto a common output data level and outputted as indicated in function blocks 704 and 705, respectively.

On the other hand, if the protect shape structures are found in function block 703 to have widths less than MD based on the comparisons done in function block 702, then the narrow structures are expanded by one design grid per edge, as indicated in function block 703A. Then, the revised design is iteratively checked again, as many times as necessary, via function blocks 702 and 703, until all protect shape widths are found to exceed are at least equal MD.

Figure 4:
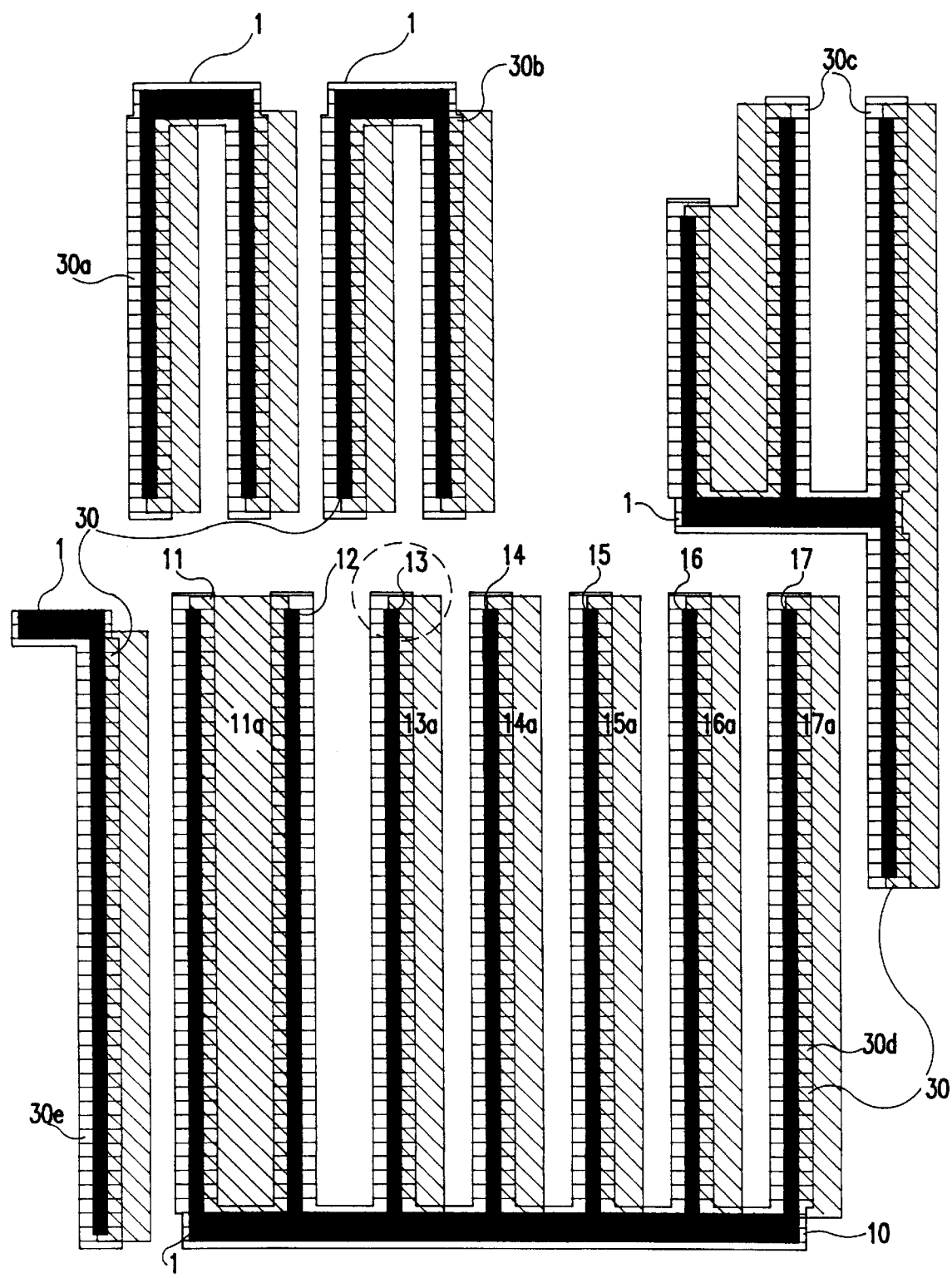
FIG. 4 shows a circuit layout implementing the trim mask pattern of the present invention including phase shapes and blockout shapes shown as horizontally striped areas.

Referring now to FIG. 4, there is shown a representative embodiment of the mask set of the present invention. FIG. 4 shows blockout shapes (horizontal striped areas) constituting a trim mask configuration 30 for the sample circuitry 1 where the trim mask configuration is developed by application of inventive design routine and method described supra. This method can be applied to the circuitry 1 by use of a computer routine to automate and facilitate the calculations needed. The generation of the block out protect shapes of the trim mask 30 for the PSM design in accordance with the logic of FIG. 7 can be implemented by one of skill in a CAD application, such as IBM's hierarchical shapes processing engines as described in U.S. Pat. Nos. 5,481,473 and 5,497,334, which are incorporated herein by reference.

Figure 1:
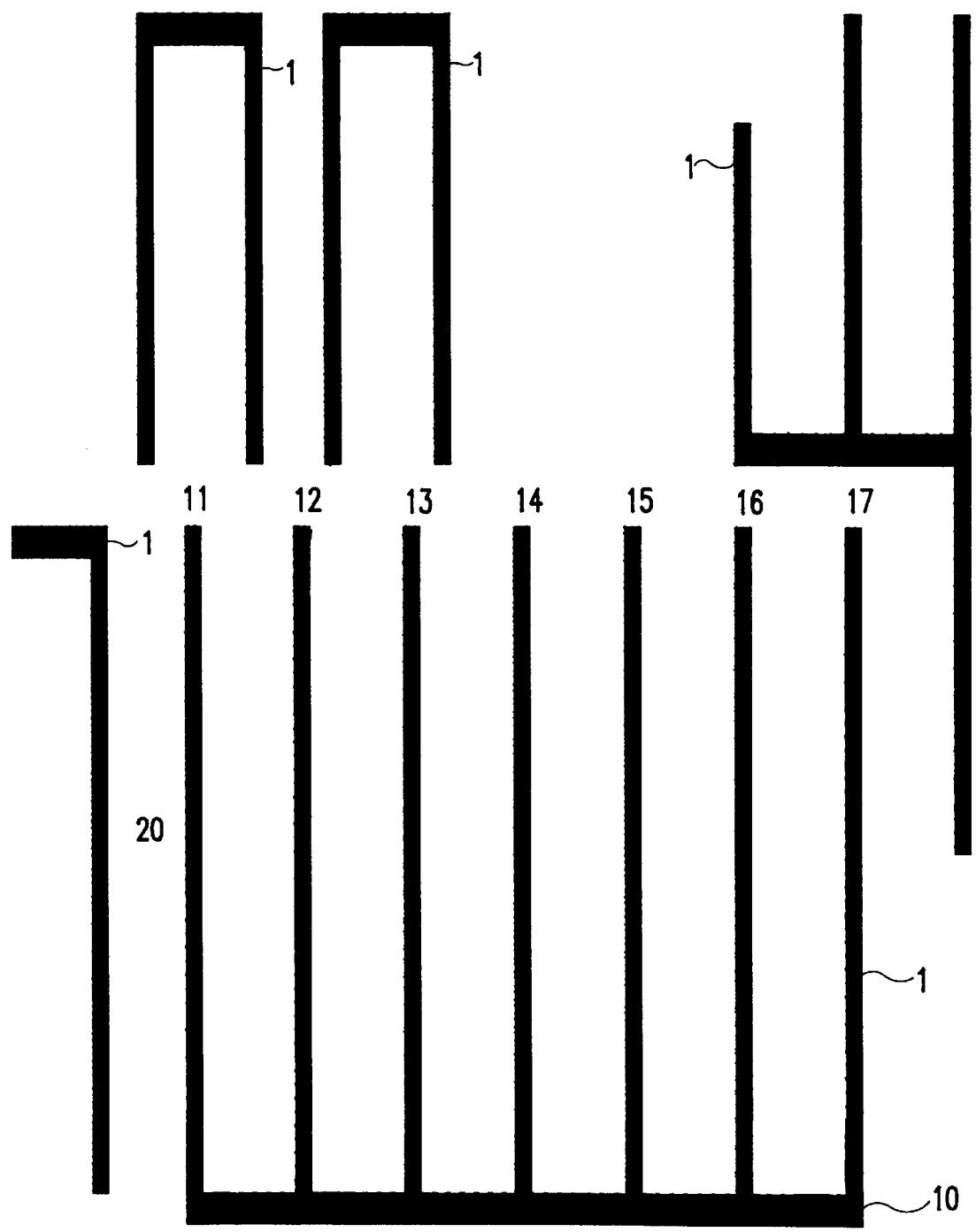
FIG. 1 shows a basic gate level circuit pattern where the solid black shapes indicate opaque (chrome) mask patterns on a transparent background.
Figure 2:
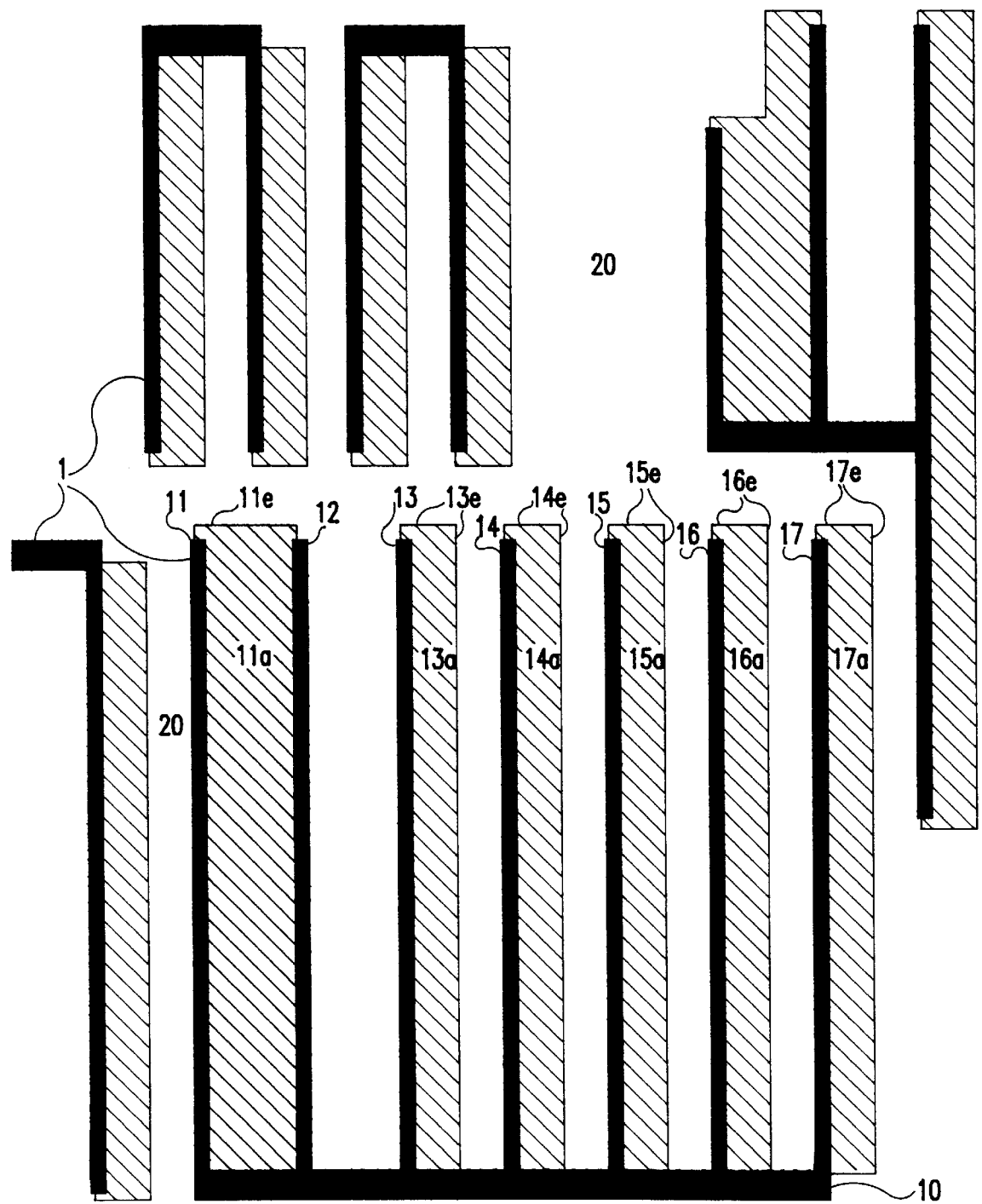
FIG. 2 shows the phase shifted design of the circuit pattern of FIG. 1, indicating residual phase edges, where the residual phase edges are edges of the phase regions (0° phase shown as blank areas; 180° phase shapes shown as diagonally shaded areas) that do not overlap onto the opaque patterns.

The circuit array 1 shown in FIG. 4 includes gate array "comb" structure 10, the same as shown in FIG. 1 as solid black areas, with the comb circuit layout 10 having the phase shapes 11*a*, 13*a*–17*a* (in the diagonally shaded areas) the same as indicated in FIG. 2. The phase shifted areas 11*a*, 13*a*–17*a* are 180° out of phase with transparent areas 20. The mask pattern shown in FIG. 2 represents a device mask that is a phase shifting mask that is used in the practice of the present invention to delineate the active feature regions and phase shifted areas.

In FIG. 4, the trim mask 30 is comprised of separate block out (protect) shapes 30*a*, 30*b*, 30*c*, 30*d* and 30*e* (indicated in horizontally striped areas). The block out shapes 30*a*–30*e* are isolated in the sense that they are formed as discrete, opaque trim masking areas against a light background, i.e., each of block out shapes 30*a*–30*e* are surrounded by light transmitting areas.

Figure 5:
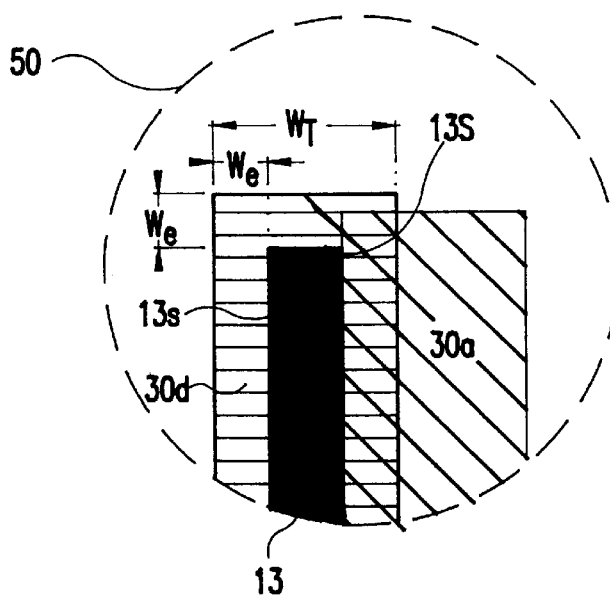
FIG. 5 is an enlarged view of the area indicated within the circular area 50 defined by the hatched lines in FIG. 4.

With reference to area 50 in isolation of the mask pattern, having a location indicated in FIG. 4 and shown in enlarged view in FIG. 5, the trim mask component 30*d* is shown as completely overlapping active feature region 13, in the perspective of a top view of the masks in alignment, and including a larger dimension such that trim mask component 30*d* extends a distance $w_e$ in any direction drawn perpendicular from the side edges 13$_s$ of active feature 13. The extension distance $w_e$ is a value of at least the overlay error for the PSM mask and protect mask, which was 75 nm for this example. The overall width $w_T$ of trim mask component 30*d* was at least 1.0 Rayleigh units, which was 500 nm for this example. Therefore, based on the width of the selected original PSM patterns, the block out protect shapes were expanded 75 nm larger than the original corresponding feature shapes as 75 nm was the value of the overlay error between the trim mask and PSM mask, and all minimum protect shape sizes were checked to make sure that they are at least 500 nm (0.5 μm) wide which constitutes 1.0 Rayleigh units for the lithography stepper contemplated for implementing this example.

The present inventors have determined that it is critical in designing the inventive trim mask to properly quantify the amount that the opaque protect shapes have to be larger (expanded) in size than the desired PSM patterns. This oversizing is necessary to prevent the lower resolution binary lithography exposed protect shapes from dominating the overall lithographic process latitude and to account for overlay errors in the trim mask to phase mask alignment.

Figure 6:
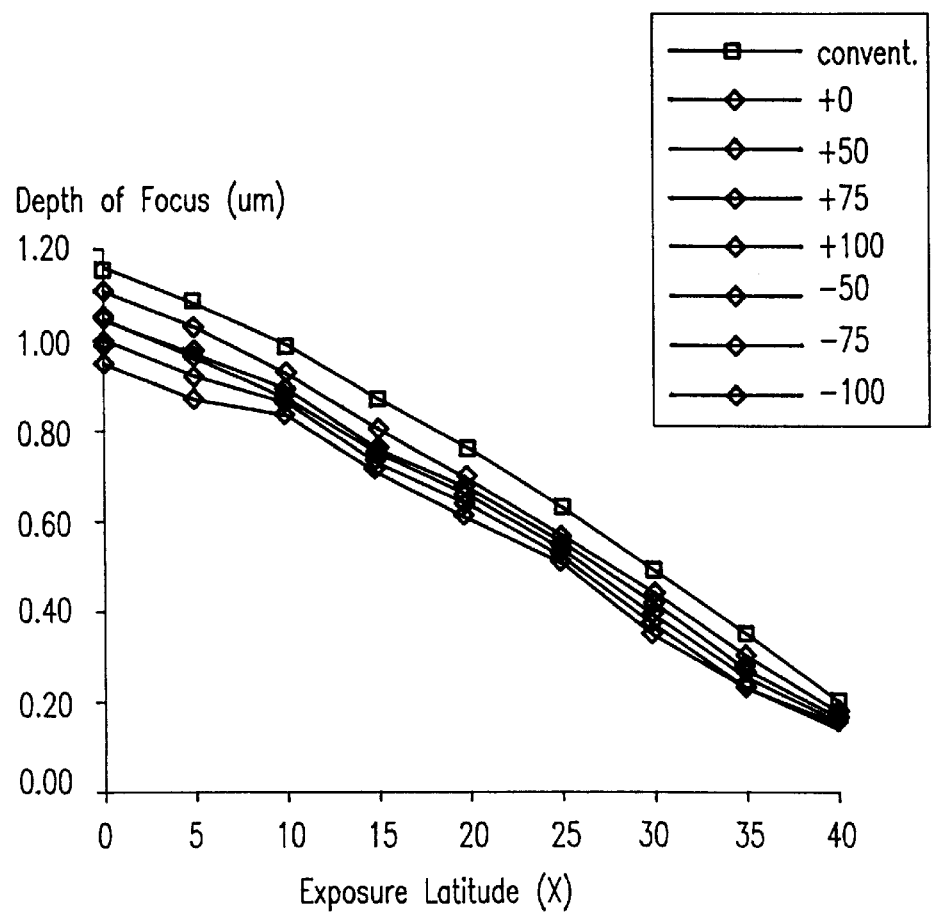
FIG. 6 shows graph comparing process latitude (depth of focus at a given exposure latitude) for the block out shape based trim mask design of the present invention (diamond) as shown in FIG. 4, compared to a conventional dark field trim mask (square) as shown in FIG. 3. Different curves with diamond markers indicate varying degrees of overlay error investigated.

Aerial image simulation ("SPLAT") has been used to evaluate the decrease in overall process latitude with reduction of block pattern size. FIG. 6 graphically shows that for the given exposure conditions (0.5 NA, 0.6 σ, 248 nm DUV), a block pattern protect size of 500 nm for a 200 nm wide PSM shape results in an average of 11% depth of focus loss at 20% exposure latitude.

Figure 3:
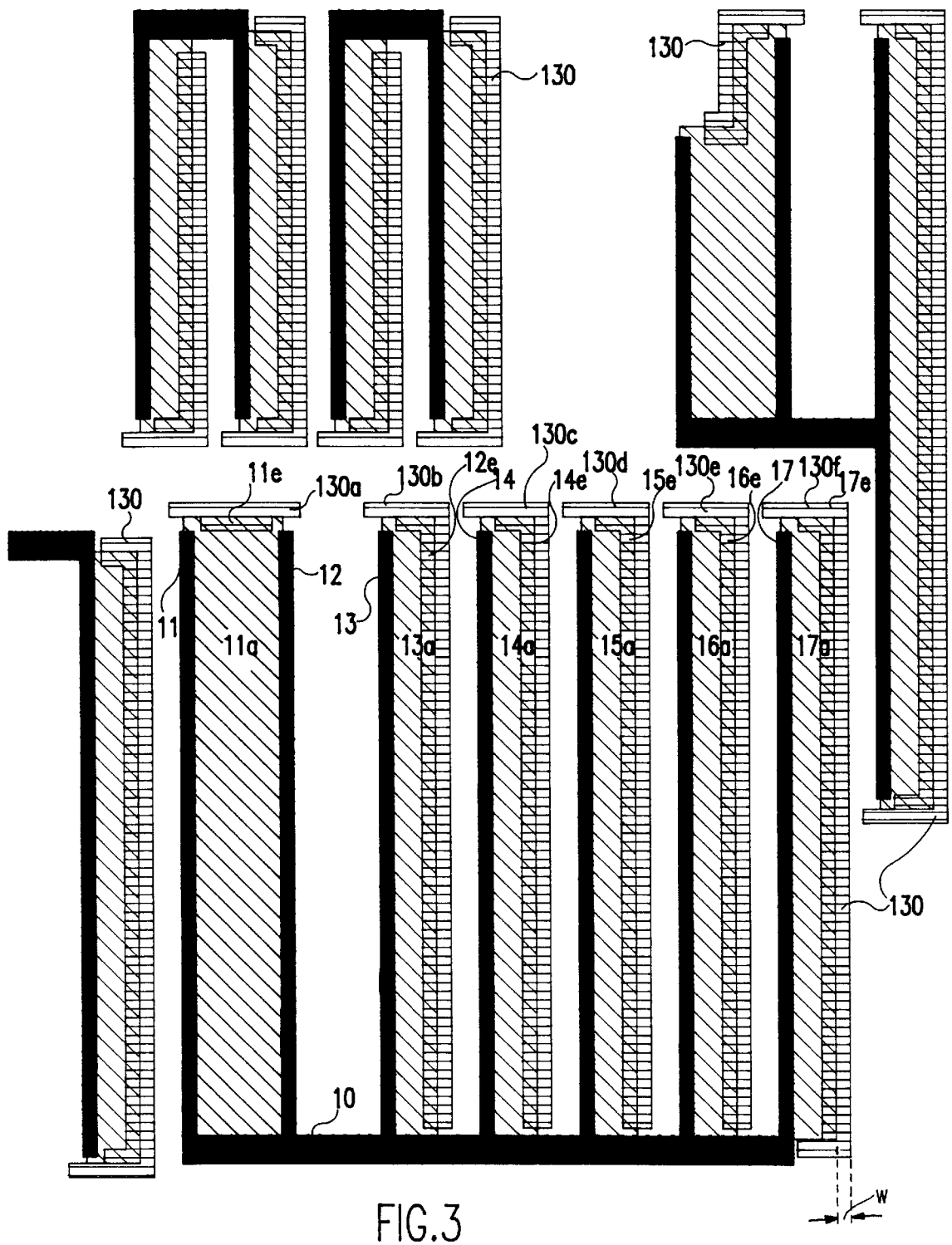
FIG. 3 shows a conventional trim edge mask design applied to a phase shifted design of the sample circuit pattern shown in FIG. 2.

The basic device and phase shifted area mask and light field trim mask design used for the results indicated with diamonds in FIG. 6 was that shown in FIG. 4. For comparison purposes, the conventional dark field trim mask investigated for this study was a mask pattern as shown in FIG. 3 where the phase edge overlap value w was 3 sigma (standard deviation of alignment overlay or alignment accuracy between the device mask and phase shifted area mask and dark field trim mask 130).

FIG. 6 shows no degradation in process latitude resulting from overlay errors over a range of ±100 nm. FIG. 6 shows that a protect shape of 500 nm width for a 200 nm wide PSM shape protects the original shape sufficiently well even if the protect shape is mis-aligned by up to 100 nm in either direction. The terminology "sufficiently well" used in the preceding sentence refers to the process latitude loss over the conventional trim mask process that does not provide the benefit of decreasing the defect sensitive area on the PSM. Based on this evaluation, it was determined that the block shapes should be designed to be expanded (relative to the original PSM pattern) a distance per edge that is at least the overlay error between the PSM and the protect mask. Also, the size of the protect shape should be that which is easily printed without benefit of phase shifting. To be "easily printed", the protect shape should be no smaller than about 1.0 Rayleigh units.

In implementing the concepts of the present invention, the opaque active feature areas formed in the PSM mask and/or trim mask can be of a sputtered metal film of chromium (Cr) or the like. The opaque features can be formed on a mask substrate such as made of a transparent quartz or synthetic polymer having a refractive index of about 1.47.

When photolithographically patterning a photosensitive layer with the mask set of this invention (i.e., the PSM mask and the protect trim mask), the PSM mask and the protect trim mask of this invention are preferably used sequentially with exposure conducted first through the PSM mask, and next with the protect trim mask, or vice versa, and the combined image is then developed out. The exposure sequence of the PSM mask and protect trim mask is interchangeable. The PSM mask and protect trim mask are used in "direct alignment" relative to the position of each other in the sequential, double exposure scheme. As an alternate embodiment, the PSM mask and protect trim mask exposures conceivably also could be effected simultaneously in a single exposure.

In the present invention, reduction of defect sensitive areas on the PSM increases mask yield and reduces inspection and repair complexity. All areas of the mask design that are not covered by the protect shapes will not have to be inspected and repaired on the PSM since images from these defects will be erased by the trim mask as used in the present invention.

While the invention has been described in terms of a preferred embodiment, those skilled in the art will recognize that the invention can be practiced with modifications within the spirit and scope of the appended claims.

What is claimed is:

1. Method of patterning a feature in a photosensitive layer, comprising the steps of:

exposing said photosensitive layer to a first mask using phase shifting, said first mask including at least one opaque active feature and a radiation transmitting phase shift area adjoining at least a portion of said opaque active feature region to form a phase edge phase shifted mask; and exposing said photosensitive layer to a second mask comprising an opaque trim masking region surrounded by radiation transmitting areas, wherein said second mask exposes said phase shift area and masks said opaque active feature region.

2. The method of claim 1, wherein said active feature region has an active feature region shape defined by active region shape side edges and said trim masking region has a trim masking region shape defined by trim masking region shape side edges, wherein said trim masking region shape completely overlaps said active feature region shape, wherein said trim masking region side edges extend a distance beyond said active region side edges of at least one overlay error between said first and second masks.

3. The method of claim 1, wherein said trim masking region in said second mask is at least about 1.0 Rayleigh units in any x-y direction.

4. The method of claim 1, wherein said first phase shifting mask comprises an opaque area defining said active feature region formed on a transparent substrate, wherein said phase shift area is formed using a subtractive process wherein said substrate is grooved at substrate portions.

5. The method of claim 1, wherein said first phase shifting mask comprises an opaque area defining said active feature region formed on a transparent substrate, wherein said phase shift area is formed using an additive process wherein a phase shift material is deposited on said substrate at substrate portions.

6. The method of claim 1, wherein said photosensitive layer is a positive photoresist layer.

7. A method for forming a device layer in a photosensitive layer, comprising the steps of:

providing a substrate having a first layer and a first photosensitive layer on said first layer;

exposing said first photosensitive layer to a first mask using phase shifting to form a first exposure pattern in said photosensitive layer, said first mask including at least one opaque active feature and a radiation transmitting phase shift area adjoining at least a portion of said opaque active feature region to form a phase edge phase shifted mask;

exposing said first patterned photosensitive layer to a second mask to form a second exposure pattern in said photosensitive layer, said second mask comprising an opaque trim masking region that masks said active region, said opaque trim masking region surrounded by radiation transmitting areas;

developing said first exposure pattern and said second exposure pattern; and removing said photosensitive layer from said first exposure pattern and said second exposure pattern.

8. The method of claim 7, wherein said active feature region has an active feature region shape defined by active region shape side edges and said trim masking region has a trim masking region shape defined by trim masking region shape side edges, wherein said trim masking region shape completely overlaps said active feature region shape, wherein said trim masking region side edges extend a distance beyond said active feature region side edges of at least one overlay error between said first and second masks.

9. The method of claim 7, wherein said trim masking region in said second mask is at least about 1.0 Rayleigh units in any horizontal direction.

10. The method of claim 7, wherein said first phase shifting mask comprises an opaque area defining said active feature region formed on a transparent substrate, wherein said phase shift area is formed using a substractive process wherein said substrate is grooved at substrate portions.

11. The method of claim 7, wherein said first phase shifting mask comprises an opaque area defining said active feature region formed on a transparent substrate, wherein said phase shift area is formed using an additive process wherein a phase shift material is deposited on said substrate at substrate portions.

12. The method of claim 7, wherein said photosensitive layer is a positive photoresist layer.

13. The method of claim 7, wherein said opaque active features areas of said first mask and said opaque trim masking region of said second mask comprise metal films formed and patterned upon transparent substrates.

14. The method of claim 7, wherein said first layer, after said step of removal of said photosensitive layer, comprises an integrated circuit pattern.

15. A mask set for forming a device layer having active feature regions defined in a photosensitive layer, comprising;
 a phase shifting mask including at least one opaque region corresponding to active features and a radiation transmitting phase shift area adjoining at least a portion of said first opaque region;
 a trim mask including an opaque region masking said active feature region, said trim mask opaque region being surrounded by radiation transmitting regions.

16. The mask set of claim 15, wherein said active feature region has an active feature region shape defined by active region shape side edges and said trim masking region has a trim masking region shape defined by trim masking region shape side edges, wherein said trim masking region shape completely overlaps said active feature region shape, wherein said trim masking region side edges extend a distance beyond said active region side edges of at least one overlay error between said phase shifting and trim masks.

17. The mask set of claim 15, wherein said trim masking region in said trim mask is at least about 1.0 Rayleigh units wide in any horizontal direction.

18. The mask set of claim 15, wherein said first phase shifting mask comprises an opaque area defining said active feature region formed on a transparent substrate, wherein said phase shift area is formed using a substractive process wherein said substrate is grooved at substrate portions.

19. The mask set of claim 15, wherein said first phase shifting mask comprises an opaque area defining said active feature region formed on a transparent substrate, wherein said phase shift area is formed using an additive process wherein a phase shift material is deposited on said substrate at substrate portions.

20. The mask set of claim 15, wherein said photosensitive layer is a positive photoresist layer.

\* \* \* \* \*